(12) United States Patent
Kobayashi (10) Patent No.: US 11,624,774 B2
(45) Date of Patent: Apr. 11, 2023

(54) IC SOCKET FOR SEMICONDUCTOR

(71) Applicant: Yamaichi Electronics Co., Ltd., Tokyo (JP)

(72) Inventor: Hiroki Kobayashi, Tokyo (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 17/259,773

(22) PCT Filed: Jul. 9, 2019

(86) PCT No.: PCT/JP2019/027212
§ 371 (c)(1),
(2) Date: Jan. 12, 2021

(87) PCT Pub. No.: WO2020/022051
PCT Pub. Date: Jan. 30, 2020

(65) Prior Publication Data
US 2021/0341533 A1 Nov. 4, 2021

(30) Foreign Application Priority Data

Jul. 27, 2018 (JP) .............................. JP2018-140914

(51) Int. Cl.
*G01R 31/28* (2006.01)
*G01R 1/04* (2006.01)
(Continued)

(52) U.S. Cl.
CPC ....... *G01R 31/2863* (2013.01); *G01R 1/0458* (2013.01); *H01L 23/32* (2013.01);
(Continued)

(58) Field of Classification Search
CPC ................ H01R 33/76; H01R 2201/20; G01R 31/2863; G01R 4/10458; H01L 23/32; H01L 27/14618
See application file for complete search history.

(56) References Cited

U.S. PATENT DOCUMENTS 4,676,571 A     6/1987  Petersen et al.
5,100,332 A *   3/1992  Egawa ................. H05K 7/1023
                                                       D13/133
(Continued)

FOREIGN PATENT DOCUMENTS

CN          2562426 Y      7/2003
CN        201548740 U      8/2010
(Continued)

OTHER PUBLICATIONS

PCT International Search Report for Application No. PCT/JP2019/027212, entitled "IC Socket for Semiconductor," dated Sep. 10, 2019.

(Continued)

*Primary Examiner* — Oscar C Jimenez
*Assistant Examiner* — Paul D Baillargeon
(74) *Attorney, Agent, or Firm* — Hamilton, Brook, Smith & Reynolds, P.C.

(57) ABSTRACT

Provided is an IC socket for a semiconductor capable of preventing adhesion of dust to a photodetection surface provided on an opposite side of a contact surface of an image sensor with no contact with the photodetection surface. The IC socket for a semiconductor includes: a seat (12) that has an attachment surface (12a) to which an image sensor (60) is attached; a base (10) that has a placement surface (10b) on which the seat (12) is placed and a secured surface (10a) located on an opposite side of the placement surface (10b) and secured to an inspection substrate; and a lid member (18) that does not come into contact with the image sensor (Continued)

(60) and that covers a back surface region (80) on a side of a back surface (64) of the image sensor (60) when the image sensor (60) is attached to the seat (12).

8 Claims, 6 Drawing Sheets

(51) Int. Cl.
  *H01L 23/32*  (2006.01)
  *H01L 27/146* (2006.01)
  *H01R 33/76*  (2006.01)

(52) U.S. Cl.
  CPC ....... *H01L 27/14618* (2013.01); *H01R 33/76* (2013.01); *H01R 2201/20* (2013.01)

(56) References Cited

U.S. PATENT DOCUMENTS

| | | | |
|---|---|---|---|
| 5,447,448 A * | 9/1995 | Noriyuki | H05K 7/1023 439/73 |
| 7,108,535 B1 | 9/2006 | Mingviriya | |
| 10,564,212 B2 * | 2/2020 | Mardi | G01R 31/69 |
| 2003/0049953 A1 | 3/2003 | Sausen | |
| 2003/0114034 A1 | 6/2003 | Sano et al. | |
| 2007/0049096 A1 | 3/2007 | Chen et al. | |
| 2008/0094094 A1 | 4/2008 | Ohkura | |
| 2009/0059544 A1 | 3/2009 | Gattuso | |
| 2009/0243644 A1 | 10/2009 | Chang | |
| 2018/0020131 A1 | 1/2018 | Zhao et al. | |

FOREIGN PATENT DOCUMENTS

| | | |
|---|---|---|
| JP | H02119079 A | 5/1990 |
| JP | H06086293 U | 12/1994 |
| JP | 2000113954 A | 4/2000 |
| JP | 2005174670 A | 6/2005 |
| JP | 2007078539 A | 3/2007 |
| JP | 2010-518564 A | 5/2010 |
| TW | 200306037 A | 11/2003 |
| TW | M288053 U | 2/2006 |
| WO | 2019131164 A1 | 7/2019 |

OTHER PUBLICATIONS

European Search Report, dated Apr. 4, 2022, received in European Application No. 19839832.3, entitled "IC Socket for Semiconductor".

* cited by examiner

IC SOCKET FOR SEMICONDUCTOR

This application is the U.S. National Stage of International Application No. PCT/JP2019/027212, filed Jul. 9, 2019, which designates the U.S., published in Japanese, and claims priority under 35 U.S.C. § 119 or 365(c) to Japanese Application No. 2018-140914, filed Jul. 27, 2018. The entire teachings of the above applications are incorporated herein by reference.

TECHNICAL FIELD

The present disclosure relates to an IC socket for a semiconductor.

BACKGROUND ART

In order to secure reliability of semiconductor packages mounted in electronic devices and the like as products, packages with potentials of defects are excluded through screening.

A semiconductor IC socket of a so-called open-top type as described in Patent Literature 1 includes a base that is secured to an inspection substrate, a seat on which a semiconductor package (semiconductor device) is placed, a pressor that is attached to the base so as to be able to slide in the up-down direction, and a latch that follows a pressing operation of the pressor to press the semiconductor package.

The pressor is constantly biased in the upper direction via a compression spring, and the latch is constantly biased in a closed direction in a no-load state. To attach the semiconductor package, the latch is opened via a cam mechanism by pressing and moving the pressor in the lower direction, and the semiconductor package is then placed thereinto from an upper released portion with a contact portion facing down. Thereafter, the semiconductor package is secured to the seat via the latch by releasing the pressing on the pressor, electric conduction between the semiconductor package and the inspection substrate is established by a contact terminal provided in the seat coming into contact with the contact portion provided at the bottom portion of the semiconductor package, and a state in which screening inspection can be performed is then achieved.

Incidentally, image sensors are a type of semiconductor packages. The image sensors are video elements that convert light detected by photodetection portions (photodiode portions) into electrical signals and are roughly categorized into two types, namely a CCD type and a CMOS type. Image sensors of both types are adapted such that a photodetection portion is provided on one surface (typically, an upper surface) of a semiconductor package while a contact portion is provided on the other surface (bottom surface) in many cases.

On the other hand, Patent Literature 2 discloses an IC socket provided with a heat dissipating member that allows an IC package in a state in which it is secured to a socket body to release heat energy generated in screening inspection to the outside. The IC socket is adapted such that the IC package and a heatsink are brought into close contact with each other by securing the IC package to the socket body and then pressing an upper side of the IC package with the heat dissipating member, thereby achieving heat dissipation.

Also, Patent Literature 3 and Patent Literature 4 disclose IC sockets that secure IC packages by pressing upper portions of the IC packages via upper surface covers.

CITATION LIST

Patent Literature

[PTL 1]
  Japanese Unexamined Patent Application, Publication No. 2005-174670
[PTL 2]
  Japanese Unexamined Patent Application, Publication No. 2000-113954
[PTL 3]
  Japanese Unexamined Patent Application, Publication No. Hei2-119079
[PTL 4]
  Japanese Unexamined Utility Model Application, Publication No. Hei6-86293

SUMMARY OF INVENTION

Technical Problem

When a burn-in test using the aforementioned socket is applied to an image sensor, the following problem may occur. In other words, in a case in which a burn-in test of the image sensor is performed with the IC socket disclosed in Patent Literature 1, there is a concern that foreign matters such as contamination adheres to a photodetection surface (glass surface) during the test since the photodetection surface is provided on the upper surface side in a state in which the image sensor is placed on a seat. If foreign matters such as contamination adheres, there is a concern that performance may be degraded, which is unfavorable. In particular, there is a high probability that the adhering foreign matters adversely affect the glass surface in a burn-in test in a high-temperature atmosphere.

Also, in a case in which burn-in tests of image sensors are performed with IC sockets disclosed in Patent Literatures 2 to 4, there is a concern that photodetection elements may cause distortion or may be damaged if the entire upper surfaces of the image sensors are pressed. Further, some image sensors include photodetection surfaces formed within the same planes as the upper surfaces of the packages, and in such a case, there is a concern that the photodetection elements may be damaged if the upper surfaces of the packages are directly pressed.

The present disclosure was made in view of such circumstances, and an object thereof is to provide an IC socket for a semiconductor capable of preventing adhesion of dust to a photodetection surface provided on an opposite side of a contact surface of an image sensor with no contact with the photodetection surface.

Solution to Problem

In order to solve the aforementioned problem, an IC socket for a semiconductor according to the present disclosure employs the following solutions.

In other words, an IC socket for a semiconductor according to an aspect of the present disclosure includes: a seat that has an attachment surface to which an image sensor is attached; a base that has a placement surface on which the seat is placed and a secured surface located on an opposite side of the placement surface and to be secured to an inspection substrate; and a lid member that does not come into contact with the image sensor and that covers a back surface region located on a side of a back surface of the image sensor when the image sensor is attached to the seat.

According to the IC socket for a semiconductor of the aspect, it is possible to cover the back surface region located on the side of the back surface of the image sensor with the lid member in a non-contact manner when the image sensor is attached to the attachment surface of the seat. In this manner, it is possible to prevent adhesion of dust to a photodetection surface provided on the back surface located on the opposite side of a contact surface (a surface of a semiconductor package attached to the attachment surface of the seat) of the image sensor with no contact with the photodetection surface.

Also, the IC socket for a semiconductor of an aspect of the present disclosure further includes: a cover that is attached so as to slide relative to the base in a perpendicularly intersecting direction that perpendicularly intersects the attachment surface, and the lid member follows the sliding of the cover to cover and release the back surface region.

According to the IC socket for a semiconductor of the aspect, it is possible to easily open and close the lid member by following the sliding of the cover. In other words, it is possible to easily cover and release the back surface region of the image sensor when the image sensor is attached to the seat.

Also, the IC socket for a semiconductor according to an aspect of the present disclosure further includes: a support shaft that attaches the lid member to the cover such that the lid member is able to turn; and a releasing mechanism that follows a motion of sliding the cover in a pressing direction directed from a side of the placement surface to a side of the secured surface to cause the lid member to turn around the support shaft so as to release the back surface region.

According to the IC socket for a semiconductor of the aspect, it is possible to cause the lid member to turn around the support shaft by causing the cover to slide in the pressing direction. In this manner, it is possible to release the back surface region of the image sensor merely by pressing the cover on the side of the secured surface on which the inspection substrate is located and thereby to easily attach the image sensor.

Also, in the IC socket for a semiconductor according to an aspect of the present disclosure, the releasing mechanism includes a push rod that is secured to the base, is provided to stand in the perpendicularly intersecting direction, and abuts on the lid member to press the lid member in an opening direction.

According to the IC socket for a semiconductor of the aspect, it is possible to push the lid member in the opening direction and cause the lid member to turn around the support shaft with the push rod. In this manner, it is possible to realize the turning of the lid member with a simple structure.

In the IC socket for a semiconductor according to an aspect of the present disclosure, the lid member has a notch portion at an edge of a distal end located on an opposite side of the support shaft and edges of side surfaces connected to both ends of the edge of the distal end, and the cover has an abutting portion that has a shape corresponding to the notched portion and touch the notch portion when the lid member is in a closed state.

In the IC socket for a semiconductor according to the aspect, the cover has the abutting portion that abuts on the notch portion of the lid member in a closed state in which the lid member covers the back surface region. In this manner, the abutting portion serves as a stopper for the lid member, and it is thus possible to maintain the closed state of the lid member. Also, the abutting portion with the shape corresponding to the notch portion is included, and it is thus possible to prevent entrance of dust into the back surface region from a gap between the lid member and the cover.

Also, in the IC socket for a semiconductor according to an aspect of the present disclosure, the lid member has a first lid member and a second lid member, and the first lid member and the second lid member are disposed to face each other in a same plane.

According to the IC socket for a semiconductor of the aspect, since the lid member has the first lid member and the second lid member disposed to face each other in the same plane, it is possible to curb the height of the entire IC socket for a semiconductor in the opened state in which the lid member releases the back surface region as compared with a case in which a single lid member is included.

Also, in the IC socket for a semiconductor according to an aspect of the present disclosure, the first lid member has a notch portion at an edge of a distal end located on an opposite side of the support shaft, and the second lid member has, at a distal end, an abutting portion that has a shape corresponding to the notched portion and touch the notch portion when the lid member is in a closed state.

According to the IC socket for a semiconductor of the aspect, the abutting portion with the shape corresponding to the notch portion is included, and it is thus possible to prevent entrance of dust into the back surface region from a gap between the first lid member and the second lid member.

Also, the IC socket for a semiconductor according to an aspect of the present disclosure further includes: a tubular guide rib that is provided to stand in a pulling direction directed from the secured surface to the placement surface and that surrounds the attachment surface, and when the lid member is in a closed state, the lid member abuts on an end portion of the guide rib on a side of the pulling direction.

According to the IC socket for a semiconductor of the aspect, since the end portion on which the guide rib abuts serves as a stopper of the lid member, it is possible to maintain the closed state of the lid member. Also, since the attachment surface is surrounded by the guide rib, and the lid member abuts on the end portion of the guide rib in the closed state, it is possible to more reliably prevent entrance of dust into the back surface region.

In addition, the IC socket for a semiconductor according to an aspect of the present disclosure includes: a biasing mechanism that biases the lid member so as to cover the back surface region.

According to the IC socket for a semiconductor of the aspect, the lid member is biased so as to cover the back surface region, and it is thus possible to reliably cover the back surface region with the lid member except for the time during which the cover is slid in the pressing direction.

Advantageous Effects of Invention

According to the IC socket for a semiconductor of the present disclosure, it is possible to prevent adhesion of dust to a photodetection surface provided on a back surface located on the opposite side of a contact surface of an image sensor with no contact with the photodetection surface.

DESCRIPTION OF EMBODIMENTS

Hereinafter, an IC socket for a semiconductor according to the present disclosure will be described with reference to drawings.

First Embodiment

Hereinafter, an embodiment of the present disclosure will be described using the drawings.

First, an overview of an IC socket for a semiconductor 1A according to the present embodiment (hereinafter, simply referred to as a "socket 1A") will be described.

Figure 1:
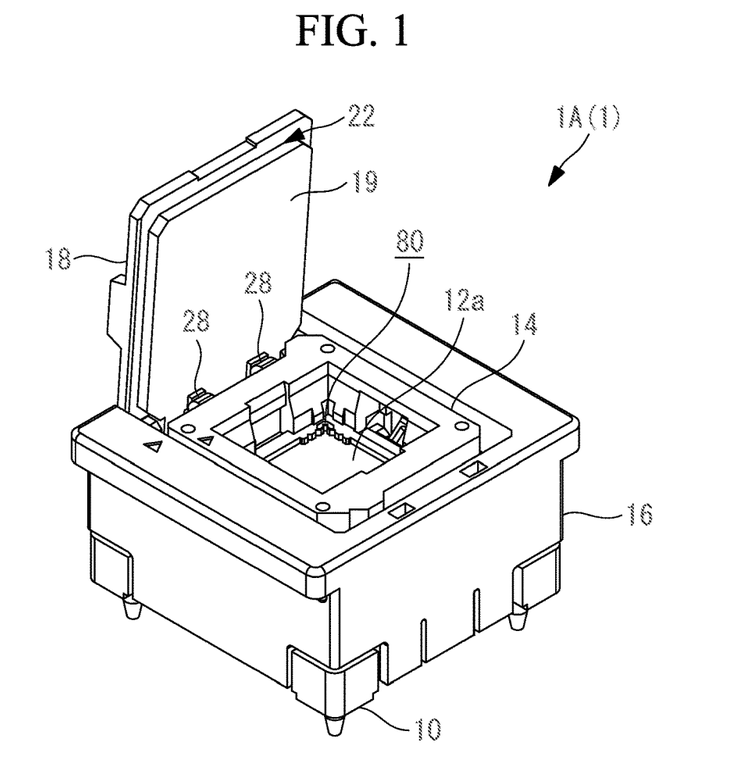
FIG. 1 is a perspective view of a lid member included in a socket in an opened state, according to a first embodiment.
Figure 2:
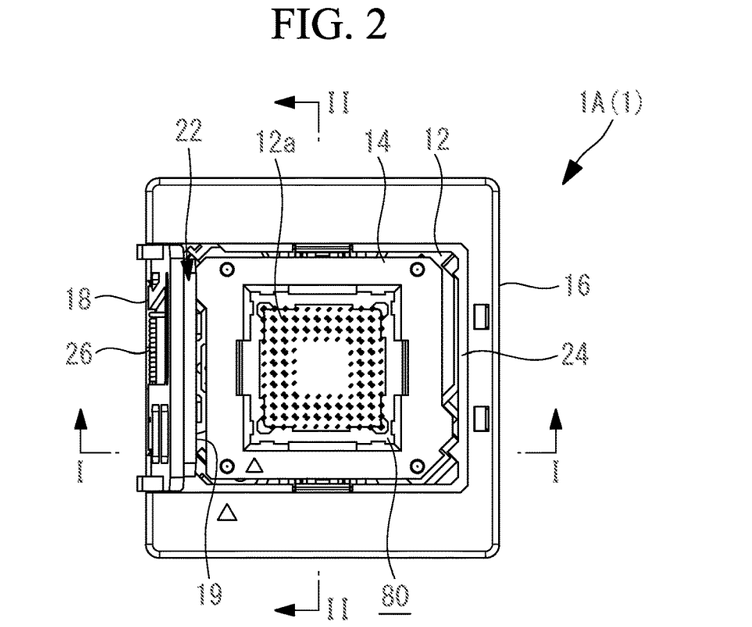
FIG. 2 is a plane view of FIG. 1 when viewed in a plane.

The socket 1A is an IC socket for a semiconductor of a so-called open-top type. FIG. 1 illustrates a perspective view of a lid member 18 included in the socket 1A in an opened state. Also, FIG. 2 is a view when the socket 1A in FIG. 1 is viewed in a plane. The socket 1A is a socket used when a burn-in test is performed on an image sensor 60 (see FIG. 5, for example), which will be described later, and includes a base 10, a seat 12 that has an attachment surface 12a, a guide rib 14, a cover 16, and a lid member 18 as illustrated in FIGS. 1 and 2.

Figure 3:
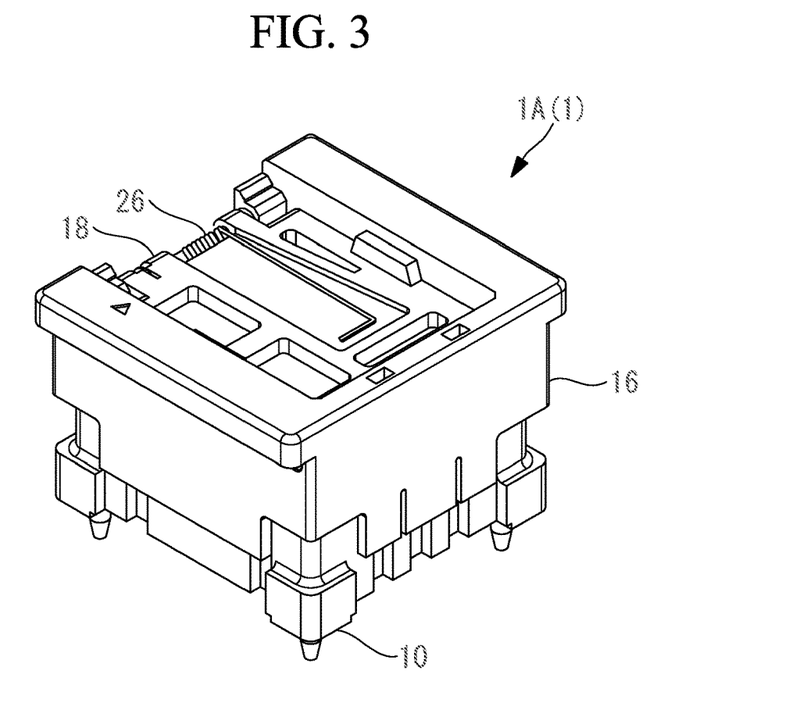
FIG. 3 is a perspective view of the lid member included in the socket in a closed state, according to the first embodiment.
Figure 4:
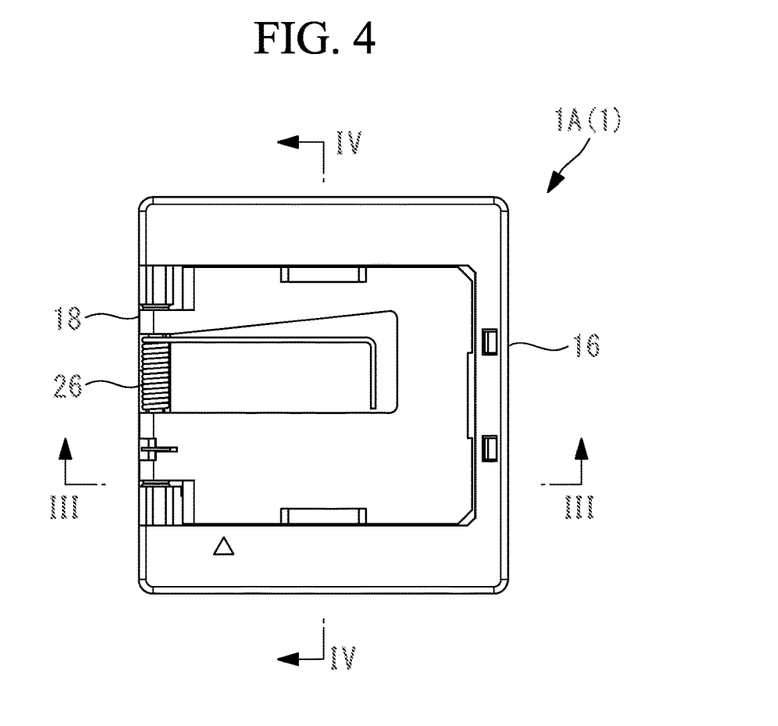
FIG. 4 is a plane view of FIG. 2 when viewed in a plane.

The lid member 18 has a substantially square shape and is brought into a closed state illustrated in FIGS. 3 and 4 from an opened state illustrated in FIGS. 1 and 2 by a releasing mechanism, which will be described later. The image sensor 60 is attached to the attachment surface 12a when the lid member 18 is in the opened state (FIGS. 1 and 2), the lid member 18 is then brought into the closed state (FIGS. 3 and 4) in a state in which the image sensor 60 is attached to the attachment surface 12a, and a burn-in test is then carried out on an inspection substrate, which is not illustrated.

Next, the socket 1A will be described in detail.

Figure 5:
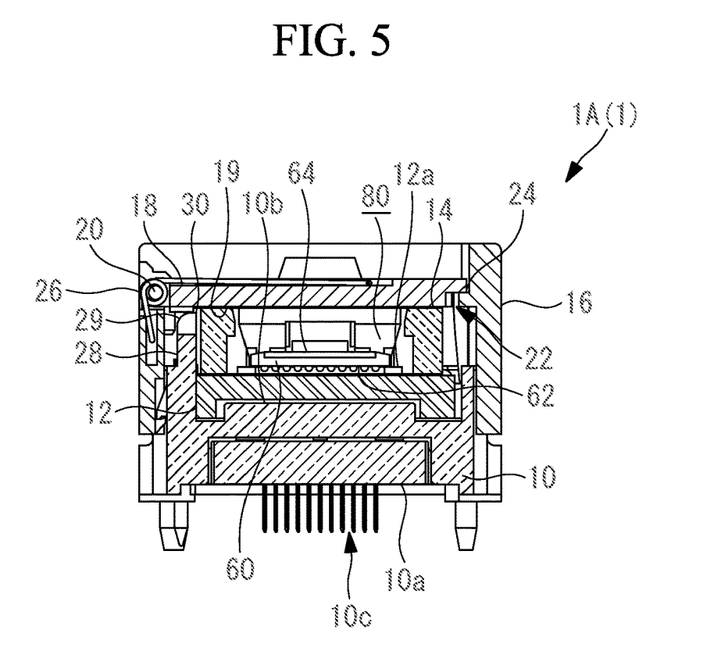
FIG. 5 is a vertical sectional view of FIG. 4 along the cut line III-III.

FIG. 5 illustrates a vertical sectional view when the socket 1A is in the closed state. The base 10 is adapted such that a secured surface 10a of a lower surface thereof, which is illustrated, is mounted on the inspection substrate, which is not illustrated. A plurality of terminals 10c are drawn from the secured surface 10a. These terminals 10c are electrically connected to the inspection substrate, which is not illustrated.

The base 10 has a placement surface 10b on the opposite side (the upper side in FIG. 5) of the secured surface 10a. On the side of the placement surface 10b, the seat 12 is placed. The seat 12 can slide in the left-right direction illustrated in the drawing relative to the placement surface 10b. The seat 12 includes an attachment surface 12a formed on the surface on the opposite side (the upper side in FIG. 5) of the surface thereof facing the placement surface 10b of the base 10. The image sensor 60, which will be described later, is placed on the attachment surface 12a.

The image sensor 60 has a thin plate shape, and the lower surface thereof, which is illustrated in the drawing, serves as a contact surface 62. The image sensor 60 is placed on the attachment surface 12a with the contact surface 62 and the attachment surface 12a of the seat 12 brought into surface contact with each other. A plurality of solder balls are formed on the contact surface 62. The plurality of solder balls are pinched with tweezer-type contacts provided on the attachment surface 12a, which are not illustrated, and are electrically connected thereto.

Also, the image sensor 60 is attached and secured to the attachment surface 12a by the solder balls formed in the image sensor 60 being pinched with the contacts provided on the attachment surface 12a. The contacts are electrically connected to the aforementioned terminals 10c. In this manner, the inspection substrate and the image sensor 60 are electrically connected to each other, and a burn-in test can thus be carried out. On the other side, the upper surface of the image sensor 60, which is illustrated in the drawing, serves as a sensor surface. A photodetection surface that has a photodetection element is provided on the sensor surface.

Note that the image sensor 60 may be of a land grid array (LGA) type in which a plane electrode pads aligned in a grid shape are formed, instead of a ball grid array (BGA) type in which solder balls are formed as described above.

A cover 16 that can slide in a perpendicularly intersecting direction (the up-down direction in FIG. 5) that perpendicularly intersects the attachment surface 12a is placed on the base 10. As illustrated in FIGS. 1 to 5, the cover 16 is a tubular member that surrounds the base 10, the seat 12, and a side portion of the guide rib 14 in the perpendicularly intersecting direction. The cover 16 is biased by a spring member, which is not illustrated, in a pulling direction (the direction directed from the lower side to the upper side illustrated in the drawing) directed from the secured surface 10a to the placement surface 10b relative to the base 10.

Figure 6:
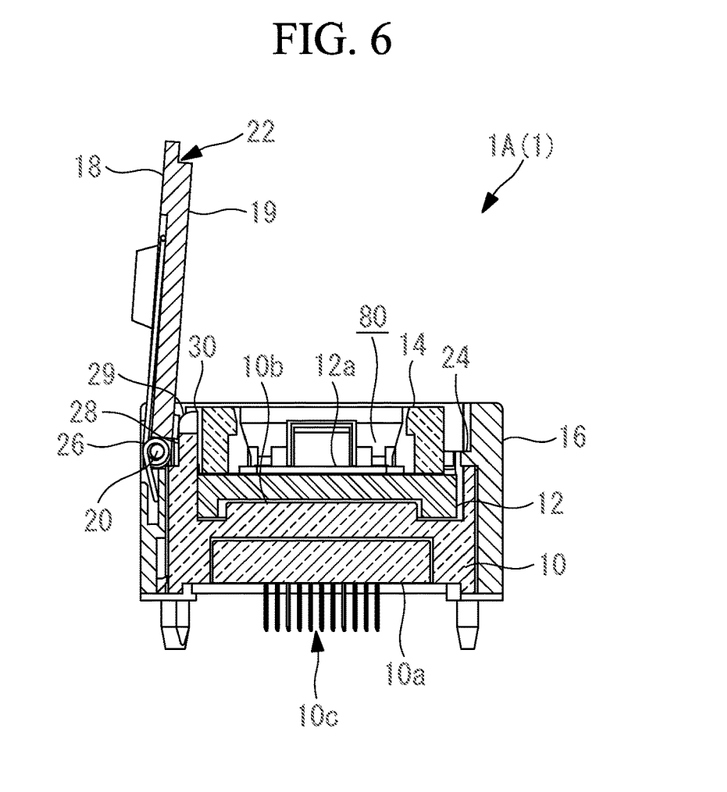
FIG. 6 is a vertical sectional view of FIG. 2 along the cut line I-I.

As illustrated in FIGS. 5 and 6, the lid member 18 is placed at the cover 16 so as to freely turn around the support shaft 20. As the support shaft 20, a pin member that is inserted into an end portion of the lid member 18, for example, is used. When the lid member 18 is in the closed state illustrated in FIG. 5, a state in which the lid member 18 covers a back surface region 80 located on the side of the back surface (hereinafter, referred to as an "upper surface 64") located on the opposite side of the contact surface 62 of the image sensor 60 is achieved. On the other hand, when the lid member 18 is in the opened state illustrated in FIG. 6, a state in which the lid member 18 releases the back surface region 80 is achieved.

When the lid member 18 is in the closed state, and the image sensor 60 is attached (the state in FIG. 5), the distance from a bottom surface 19 (the surface that comes into contact with the back surface region 80 when the lid member 18 is in the closed state) of the lid member 18 to the upper surface 64 of the image sensor is about 0.1 mm to about 5.0 mm. Also, when the lid member 18 is in the closed state, and the image sensor 60 is not attached, the distance from the bottom surface 19 of the lid member 18 to the attachment surface 12a is about 0.1 mm to about 5.0 mm.

The lid member 18 is biased by the biasing mechanism 26 to constantly turn in a direction (a direction in which the closed state is achieved) in which the back surface region 80 is covered. As the biasing mechanism 26, a torsion spring as illustrated in FIGS. 3 to 5, for example, is used. The torsion spring is provided at the support shaft 20 such that one end thereof is connected to the cover 16 while the other end is in contact with the lid member 18. Note that the biasing mechanism 26 is not limited to the torsion spring illustrated in the drawing, and any biasing mechanism may be employed as long as the lid member 18 is biased such that the lid member 18 turns in the direction in which the lid member 18 covers the back surface region 80.

As illustrated in FIGS. 1, 5, 6, and 7, a notch portion 22 is formed at an edge on the side of the distal end of the lid member 18 located on the opposite side of the support shaft 20 and edges on the sides of side surfaces connected to both ends of the edge. In other words, the notch portion 22 is formed along the peripheral edges of three sides except for one side on the side on which the support shaft 20 is inserted, from among four sides of the lid member 18 with a substantially square shape.

The notch portion 22 is notched in a plate thickness direction from the side of the bottom surface 19 of the lid member 18 along the peripheral edges of the three sides described above. Also, the vertical section of the notch portion 22 is a rectangular shape. Note that the shape of the notch portion 22 is not limited to the shape, may be any shape notched from the side of the bottom surface 19 of the lid member 18, and may be, for example, an arc shape, a step shape, or a shape as a combination thereof.

Also, as illustrated in FIGS. 1, 5, and 6, an abutting portion 24 is provided at a wall portion of the cover 16 that faces the notch portion 22 when the lid member 18 is in the closed state. The abutting portion 24 has a projecting shape, with which the abutting portion 24 abuts on the notch portion 22 from the side of the bottom surface 19 when the lid member 18 is in the closed state, which corresponds to the shape of the notch portion 22. In this manner, the notch portion 22 and the abutting portion 24 overlap each other in the projecting direction of the abutting portion 24.

The guide rib 14 has such a tubular shape that surrounds the attachment surface 12a. The guide rib 14 is provided to stand in a pulling direction (the direction from the lower side to the upper side illustrated in the drawing) directed from the secured surface 10a to the placement surface 10b.

As illustrated in FIG. 5, the guide rib 14 is set to have a height with which an end portion thereof on the side of the pulling direction abuts on the bottom surface 19 of the lid member 18 when the lid member 18 is brought into the closed state and covers the back surface region 80 or to have a height that is less than the height. The guide rib 14 is placed at the base 10 with a hook, which is not illustrated, so as not to be separated therefrom and is configured to follow sliding of the seat 12.

Next, the releasing mechanism that causes the lid member 18 to turn from the closed state to the opened state will be described.

The releasing mechanism includes push rods 28 with rod shapes that have proximal ends at the base 10 as illustrated in FIGS. 5 and 6. The push rods 28 are provided to stand in a direction that perpendicularly intersects the attachment surface 12a.

The push rods 28 are configured such that distal ends thereof (the upper ends illustrated in the drawing; the ends on the opposite side of the distal ends) abut on the bottom surface 19 of the lid member 18. The distal end sides of the push rods 28 are formed as R portions 29 rounded into quarter-arc shapes. Further, upper ends of the R portions 29 serve as R upper ends 30. When the lid member 18 is in the closed state (the state in FIG. 5), the R upper ends 30 abut on the bottom surface 19 of the lid member 18. Note that although two push rods 28 are formed as illustrated in FIG. 1 in the case of the present embodiment, the number of the push rods 28 may be one or may be three or more.

The push rods 28 have the following actions. In other words, when the cover 16 is caused to slide in the pressing direction (the direction directed from the upper side to the lower side illustrated in FIGS. 5 and 6) directed from the placement surface 10b to the secured surface 10a, since the push rods 28 are secured to the base 10, the R portions 29 of the push rods 28 pushes the lid member 18 upward from the side of the bottom surface 19. At this time, the lid member 18 is supported by the support shaft 20 so as to freely turn. As a result, the push rods 28 serve as points where force works, and the lid member 18 releases the back surface region 80 so as to be turned around the support shaft 20. In other words, the lid member 18 is brought into the opened state. At this time, the cover 16 is biased in the pulling direction relative to the base 10 as described above. Therefore, it is possible to bring the lid member 18 into the opened state by applying a load in the pressing direction to the cover 16. On the contrary, in a state (standby state) in which no load is applied to the cover 16, the lid member 18 is brought into a closed state by the biasing mechanism 26.

Note that the push rod 28 and the lid member 18 smoothly slide by forming the R portions 29 at the push rods 28.

Also, it is possible to curb the length by which the push rods 28 are provided to stand, by locating the positions at which the push rods 28 are provided to stand, that is, the positions of the R upper ends 30 to be close to the side of the support shaft 20. In other words, it is possible to curb the height of the entire socket 1A.

However, if the positions of the R upper ends 30 are located to be excessively close to the side of the support shaft 20, the distance between the push rods 28 as a point where force works and the support shaft 20 becomes short, and large force is thus needed to turn the lid member 18. In other words, force needed to slide the cover 16 in the pressing direction increases. Therefore, the positions and the lengths of the push rods 28 are not limited to the form illustrated in the drawing, and it is preferable that the positions and the lengths thereof be appropriately designed in accordance with the specification of the socket 1A.

The seat 12 also slides as described above by causing the cover 16 to slide in the pressing direction. The sliding of the seat 12 is performed by a mechanism, which is not illustrated, and the tweezer-type contacts provided on the attachment surface 12a, which are not illustrated, are opened or closed along with the sliding. Specifically, the tweezer-type contacts are brought into the opened state when the cover 16 is caused to slide in the pressing direction.

Also, the tweezer-type contacts are brought into the closed state when the cover 16 is caused to slide in the pulling direction. In other words, the tweezer-type contacts are brought into the opened state when the lid member 18 releases the back surface region 80, and at the same time, the image sensor 60 can be attached to the attachment surface 12a.

Also, the tweezer-type contacts are brought into the closed state when the lid member 18 covers the back surface region 80, and at the same time, the contacts pinch the plurality of solder balls formed on the contact surface 62 of the image sensor 60, thereby securing the image sensor 60 to the attachment surface 12a.

Figure 7:
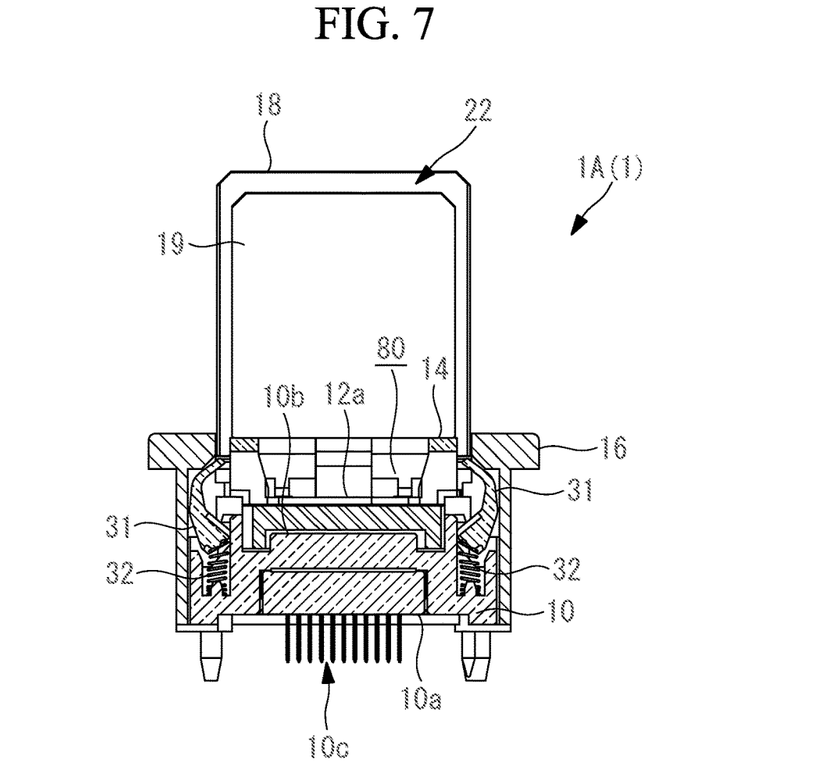
FIG. 7 is a vertical sectional view of FIG. 2 along the cut line II-II.
Figure 8:
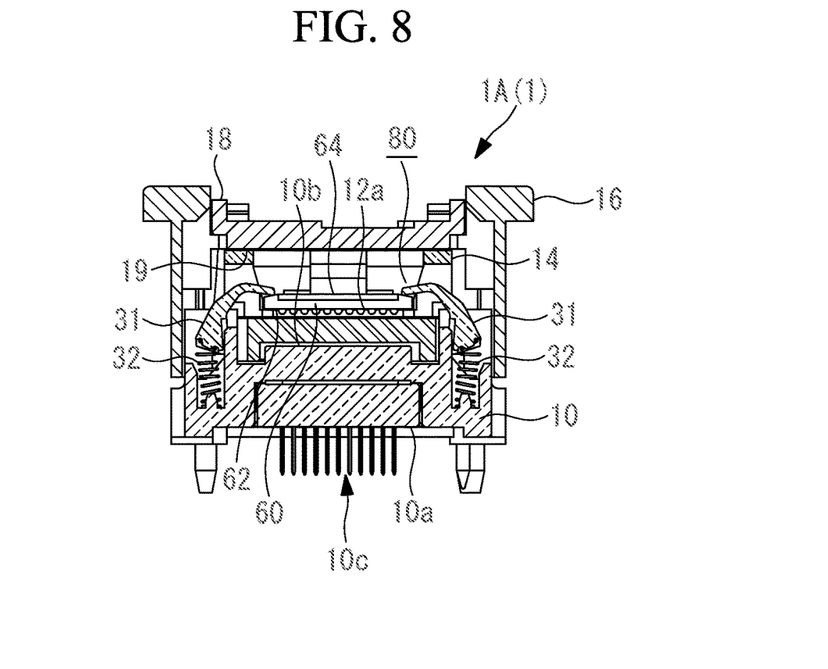
FIG. 8 is a vertical sectional view of FIG. 4 along the cut line IV-IV.

Further, hook-shaped latches 31 are opened and closed with the sliding of the cover 16 as illustrated in FIGS. 7 and 8. The latches 31 face each other with the seat 12 sandwiched therebetween in the width direction of the lid member 18 and is provided such that distal ends of the hook shapes face the side of the seat 12. The width direction of the lid member 18 is a direction of the lid member 18 into which the support shaft 20 is inserted and is the left-right direction illustrated in FIGS. 7 and 8.

The latches 31 are connected to the base 10 via springs 32. The latches 31 are biased by the springs 32 such that the hook-shaped distal ends thereof come into contact with the upper surface 64 of the image sensor 60 attached to the seat 12 when the lid member 18 is in the closed state (the state in FIG. 8). Note that the latches 31 are not adapted to press and secure the image sensor 60 and are adapted to be brought into slight contact with the image sensor 60 so as to curb deviation of the image sensor 60. Also, the latches 31 release the seat 12 on the side of the back surface region 80 when the lid member 18 is in the opened state. It is thus possible to attach and detach the image sensor 60. Note that the latches 31 are not necessary configuration requirements in the present disclosure.

The present embodiment has the following advantages.

It is possible to cover the back surface region 80 located on the side of the upper surface 64 of the image sensor 60 in a non-contact manner when the image sensor 60 is attached to the attachment surface 12*a* of the seat 12. In this manner, it is possible to prevent adhesion of dust to the photodetection surface provided on the upper surface 64 located on the opposite side of the contact surface 62 of the image sensor 60 with no contact with the photodetection surface.

Also, it is possible to easily open and close the lid member 18 by following the sliding of the cover 16 by employing a simple structure of the push rods 28. In other words, it is possible to easily cover and release the back surface region 80 of the image sensor 60 when the image sensor 60 is attached to the seat 12.

Also, the abutting portion 24 that abuts on the notch portion 22 of the lid member 18 in the closed state when the lid member 18 covers the back surface region 80 is formed in the cover 16. In this manner, the abutting portion 24 serves as a stopper of the lid member 18, and it is thus possible to maintain the closed state of the lid member 18. Also, since the abutting portion 24 has the shape corresponding to the notch portion 22, and overlapping portions are provided, it is possible to prevent entrance of dust into the back surface region 80 from the gap between the lid member 18 and the cover 16.

Also, in a case in which the end portion of the guide rib 14 on the side of the pulling direction is designed to abut on the bottom surface 19 of the lid member 18 when the lid member 18 is in the closed state, the guide rib 14 serves as a stopper of the lid member 18, and it is thus possible to maintain the closed state of the lid member 18. Also, since the attachment surface 12*a* is surrounded by the guide rib 14, and the lid member 18 covers the back surface region 80 and abuts on the end portion of the guide rib 14, it is possible to more reliably prevent entrance of dust into the back surface region 80.

Second Embodiment

Next, a second embodiment of the present disclosure will be described using drawings.

A socket 1B according to the present embodiment is different from the first embodiment in the shape of the lid member 18, and the other points are similar to those in the first embodiment. Therefore, only points that are different from those in the first embodiment will be described, and description of the other points will be omitted by using the same reference signs.

A lid member 18 has a first lid member 18*a* and a second lid member 18*b* as illustrated in FIGS. 9 to 12. The first lid member 18*a* and the second lid member 18*b* are placed to face each other in a plane that is parallel to an attachment surface 12*a*. Also, the first lid member 18*a* and the second lid member 18*b* are supported by a support shaft 20*a* and a support shaft 20*b*, respectively, so as to freely turn, and a push rod 28*a* and a push rod 28*b* as releasing mechanisms are provided for the first lid member 18*a* and the second lid member 18*b*, respectively.

Figure 11:
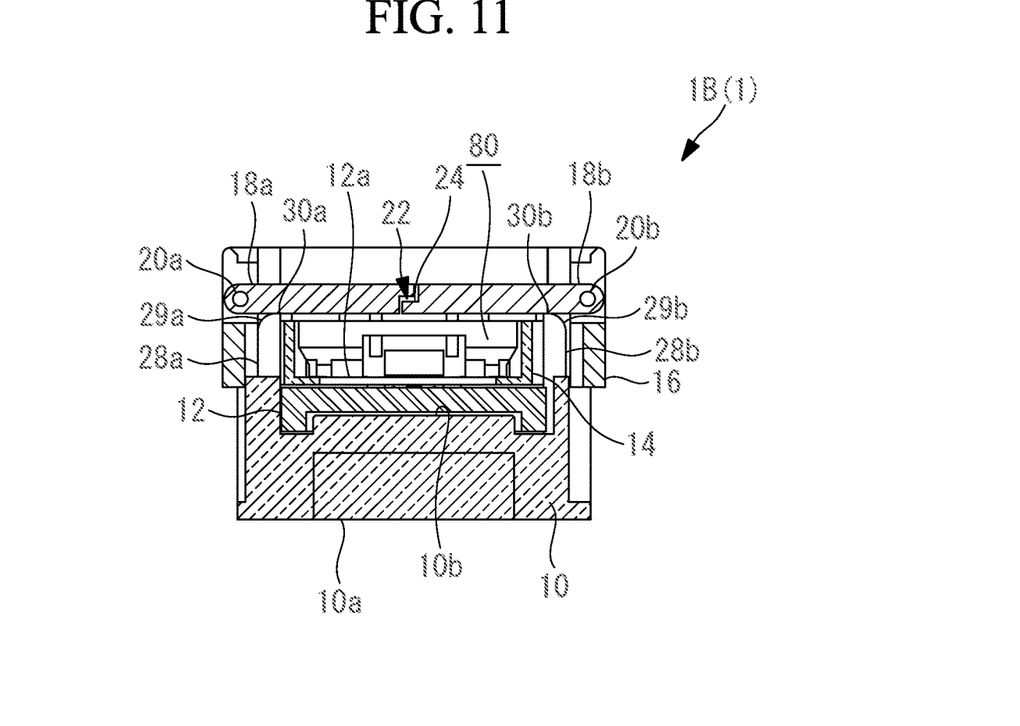
FIG. 11 is a vertical sectional view of FIG. 10.
Figure 12:
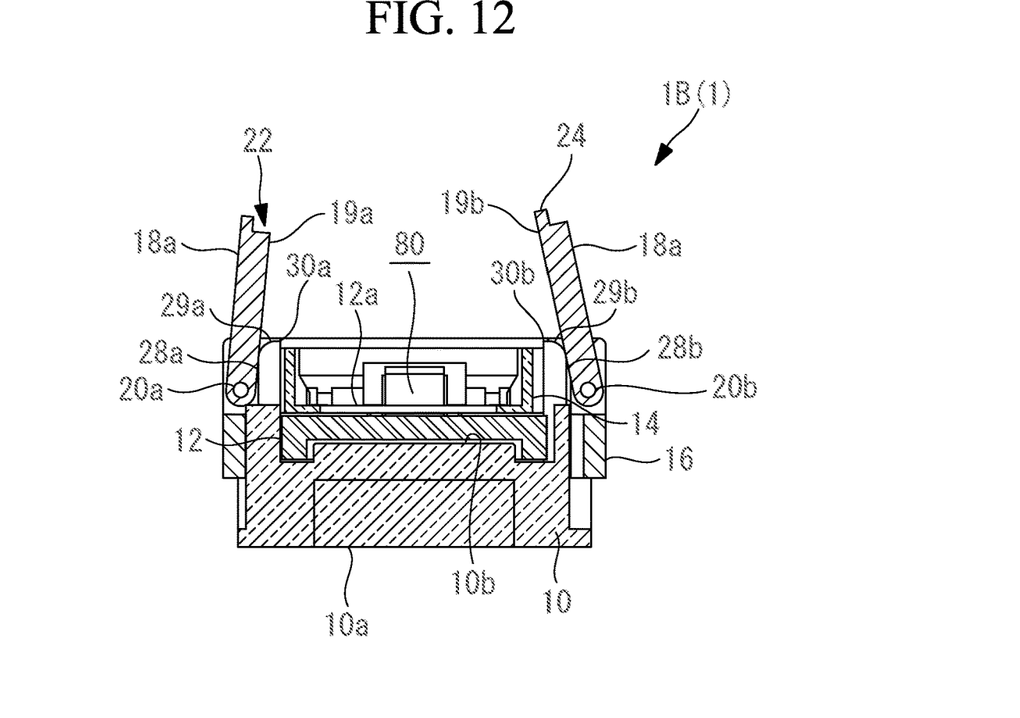
FIG. 12 is a vertical sectional view of FIG. 9.

In a case of FIGS. 11 and 12, the element on the left side on the paper is defined as the first lid member 18*a*, and the push rod 28*a* abuts on a bottom surface 19*a* of the first lid member 18*a*. On the other hand, the element on the right side on the paper is defined as the second lid member 18*b*, and the push rod 28*b* abuts on a bottom surface 19*b* of the second lid member 18*b*.

The first lid member 18*a* and the second lid member 18*b* are opened and closed in a double-door form as illustrated in FIGS. 9 and 10 and FIGS. 11 and 12 by the push rod 28*a* and the push rod 28*b* of the aforementioned releasing mechanisms.

A notch portion 22 is formed at an edge of a distal end of the first lid member 18*a* located on the opposite side of the support shaft 20*a* as illustrated in FIGS. 11 and 12. Also, an abutting portion 24 with a projecting shape, with which the abutting portion 24 abuts on the notch portion 22 formed in the first lid member 18*a* from the side of the bottom surface 19, which corresponds to the shape of the notch portion 22, is formed at an edge of a distal end of the second lid member 18*b* located on the opposite side of the support shaft 20*b*.

The distance between an R upper end 30*a* of an R portion 29*a* provided at the push rod 28*a* and the support shaft 20*a* in a direction in which the support shaft 20*a* and the support shaft 20*b* are connected is set to be shorter than the distance between an R upper end 30*b* of an R portion 29*b* provided at the push rod 28*b* and the support shaft 20*b*.

In this manner, it is possible to reduce the turning angle of the second lid member 18*b* as compared with the turning angle of the first lid member 18*a* when the cover 16 is caused to slide as illustrated in FIG. 12. Thus, even when the first lid member 18*a* with the notch portion 22 formed therein and the second lid member 18*b* with the abutting portion 24 formed therein are caused to turn from the opened state to the closed state by causing the cover 16 to slide in the pulling direction, for example, the position of the first lid member 18*a* on the side of the distal end and the position of the second lid member 18*b* on the side of the distal end are different from each other, and no contact is thus established therebetween. If the first lid member 18*a* on the side of the distal end and the second lid member 18*b* on the side of the distal end are brought into contact with each other when the turning from the opened state to the closed state is performed, the first lid member 18*a* and the second lid member 18*b* are brought into a form in which the first lid member 18*a* and the second lid member 18*b* support each other on the sides of the distal ends thereof and restrain each other in the turning direction, and it is not possible to achieve the closed state.

The present embodiment has the following advantages.

It is possible to cover the back surface region 80 located on the side of the upper surface 64 of the image sensor 60 in a non-contact manner when the image sensor 60 is attached to the attachment surface 12*a* of the seat 12, with the lid member 18 that has the first lid member 18*a* and the second lid member 18b. It is thus possible to prevent adhesion of dust to the photodetection surface provided on the upper surface 64 located on the opposite side of the contact surface 62 of the image sensor 60 with no contact with the photodetection surface.

Also, it is possible to easily open and close the lid member 18 through the sliding of the cover 16 by employing a simple structure of the push rods 28. In other words, it is possible to easily cover and release the back surface region 80 of the image sensor 60 when the image sensor 60 is attached to the seat 12.

Also, in a case in which the end portion of the guide rib 14 on the side of the pulling direction is designed to abut on the bottom surface 19 of the lid member 18 when the lid member 18 is in the closed state, the guide rib 14 serves as a stopper of the lid member 18, and it is thus possible to maintain the closed state of the lid member 18. In addition, the attachment surface 12a is surrounded by the guide rib 14, the lid member 18 covers the back surface region 80 and abuts on the end portion of the guide rib 14, and it is thus possible to more reliably prevent entrance of dust into the back surface region 80.

Also, since the lid member 18 has the first lid member 18a and the second lid member 18b, it is possible to curb the height of the entire socket 1B when the first lid member 18a and the second lid member 18b are opened as compared with a case in which a single lid member is provided, for example.

Also, since the abutting portion 24 with the shape corresponding to the notch portion 22 formed in the first lid member 18a is formed in the second lid member 18b, it is possible to prevent entrance of dust into the back surface region 80 from the gap between the first lid member 18a and the second lid member 18b.

Figure 9:
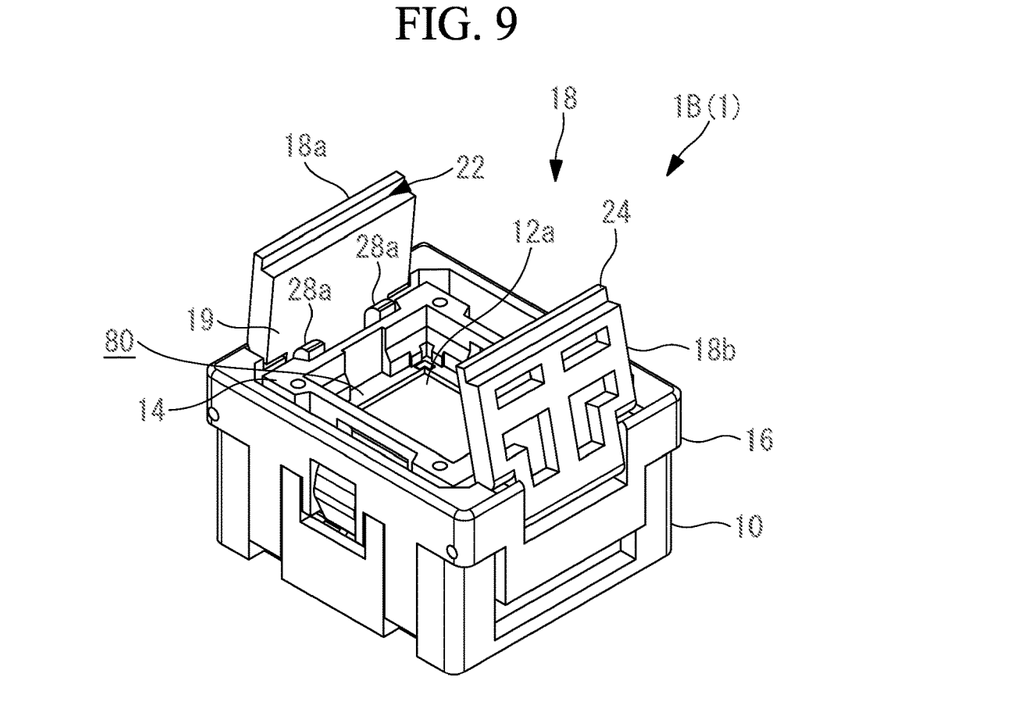
FIG. 9 is a perspective view of a lid member included in a socket in an opened state, according to a second embodiment.
Figure 10:
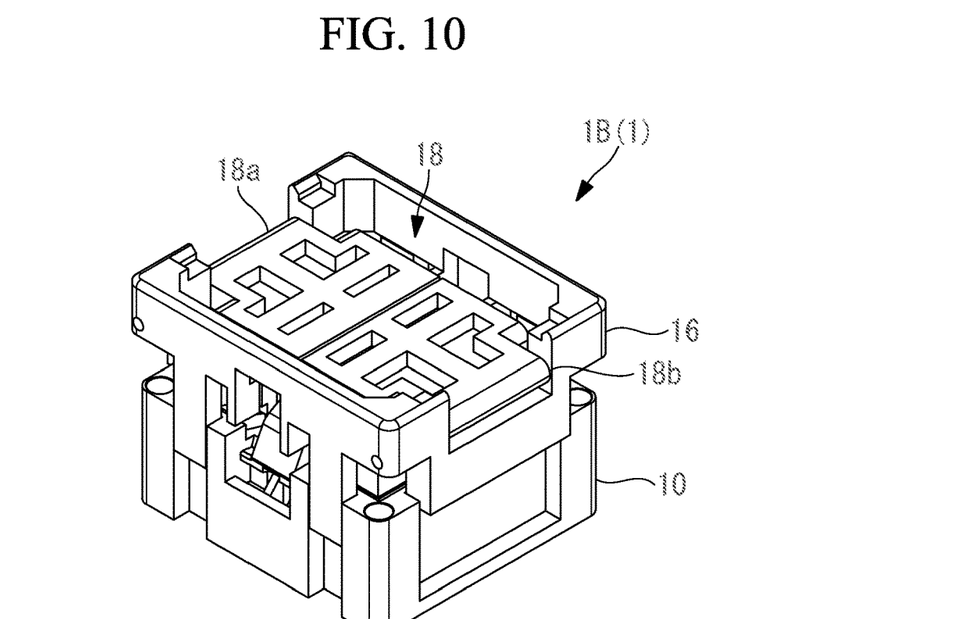
FIG. 10 is a perspective view of the lid member included in the socket in a closed state, according to the second embodiment.

Note that although no biasing mechanism 26 such as a torsion spring is illustrated in FIGS. 9 and 10, the biasing mechanism 26 may be provided similarly to the first embodiment.

REFERENCE SIGNS LIST 1 (1A, 1B) IC socket for semiconductor (socket)
10 Base
10a Secured surface
10b Placement surface
10c Terminal
12 Seat
12a Attachment surface
14 Guide rib
16 Cover
18 Lid member
18a First lid member
18b Second lid member
19 Bottom surface
20, 20a, 20b Support shaft
22 Notch portion
24 Abutting portion
26 Biasing mechanism
28, 28a, 28b Push rod (releasing mechanism)
29, 29a, 29b R portion
30, 30a, 30b R upper end
31 Latch
32 Spring
60 Image sensor
62 Contact surface
64 Back surface
80 Back surface region

The invention claimed is:

1. An IC socket for a semiconductor comprising: a seat that has an attachment surface to which an image sensor is attached;
a base that has a placement surface on which the seat is placed and a secured surface located on an opposite side of the placement surface and to be secured to an inspection substrate;
a lid member that does not come into contact with the image sensor and that covers a back surface region located on a side of a back surface of the image sensor when the image sensor is attached to the seat; and
a cover that is attached so as to slide relative to the base in a perpendicularly intersecting direction that perpendicularly intersects the attachment surface,
wherein the lid member follows the sliding of the cover to cover and release the back surface region.

2. The IC socket for a semiconductor according to claim 1, further comprising:
a support shaft that attaches the lid member to the cover such that the lid member is able to turn; and
a releasing mechanism that follows a motion of sliding the cover in a pressing direction directed from a side of the placement surface to a side of the secured surface to cause the lid member to turn around the support shaft so as to release the back surface region.

3. The IC socket for a semiconductor according to claim 1, further comprising a releasing mechanism that includes a push rod that is secured to the base, is provided to stand in the perpendicularly intersecting direction, and abuts on the lid member to press the lid member in an opening direction.

4. The IC socket for a semiconductor according to claim 1,
wherein the lid member has a notch portion at an edge of a distal end located on an opposite side of the support shaft and edges of side surfaces connected to both ends of the edge of the distal end, and
the cover has an abutting portion that has a shape corresponding to the notched portion and touch the notch portion when the lid member is in a closed state.

5. The IC socket for a semiconductor according to claim 1,
wherein the lid member has a first lid member and a second lid member, and
the first lid member and the second lid member are disposed to face each other in a same plane.

6. The IC socket for a semiconductor according to claim 1,
wherein the lid member has a first lid member and a second lid member, and wherein the first lid member has a notch portion at an edge of a distal end located on an opposite side of the support shaft, and
the second lid member has, at a distal end, an abutting portion that has a shape corresponding to the notched portion and touch the notch portion when the lid member is in a closed state.

7. The IC socket for a semiconductor according to claim 1, further comprising:
a tubular guide rib that is provided to stand in a pulling direction directed from the secured surface to the placement surface and that surrounds the attachment surface,
wherein when the lid member is in a closed state, the lid member abuts on an end portion of the guide rib on a side of the pulling direction.

8. The IC socket for a semiconductor according to claim 1, further comprising:
a biasing mechanism that biases the lid member such that the lid member is brought into a closed state.

* * * * *